July 20, 1965 J. C. McADAM 3,195,628

TRANSISTOR CONVECTION COOLER

Filed Nov. 21, 1961

INVENTOR.
JOHN C. McADAM
BY
Beehler & Shanahan
ATTORNEYS

United States Patent Office 3,195,628
Patented July 20, 1965

3,195,628
TRANSISTOR CONVECTION COOLER

John C. McAdam, Burbank, Calif., assignor, by mesne assignments, to International Electronic Research Corporation, a corporation of California Filed Nov. 21, 1961, Ser. No. 153,896
3 Claims. (Cl. 165—185)

The invention relates to heat dissipators for electronic components and especially a heat dissipator or in other words a cooler of such form and character that it can be used to particular advantage in connection with transistors.

Despite a common conception that transistors because they are effective without heating up initially do not expend much heat energy, it is conceded that there is sufficient heating during operation to make the cooling of transistors and the space in which transistors operate a notably advantageous expedient. In practice, it is common to compact circuits operated in the main by transistors into a small space. In fact, the trend of development in this regard is very markedly in the direction of compactness so that the casing or container within which transistorized equipment is mounted is just as small as it is practical to make it. The result of this trend is, of course, to mount transistors and comparable components upon a circuit board very close together. This alone produces a heating problem. When, however, the heating problem is sought to be relieved, by employment of coolers on the transistors, the crowding of the location of the components is often such that either the cooler cannot be properly applied or the components must be mounted further apart than desired in order to accommodate cooling fins and comparable expedients which extend outwardly from the cooling mounts for the purpose of dissipating heat.

Further still, when certain types of transistor coolers are employed constructed as previously advocated of relatively large masses of metal, the accumulation of relatively massive coolers in a compact arrangement detracts to an appreciable degree from the expected cooling effect.

It is therefore among the objects of the invention to provide a new and improved cooler for electronic components which is lightweight, simple, and compact but which because of its special construction is capable of dissipating a considerable amount of heat due in part to its exceptional radiating ability and in part to its ability to generate a certain degree of turbulence in convection currents which surround the device, whether used singly or in multiple installations.

Another object of the invention is to provide a new and improved single piece, sheet metal cooler for electronic components such as transistors which is so constructed that the heat dissipating flange is at a location which does not interfere with other components mounted immediately adjacent the transistor thereby permitting a compact arrangement while at the same time preserving the cooling effect.

Still another object of the invention is to provide a new and improved cooler for electronic components such as transistors which, although constructed of relatively thin sheet metal so that spring fingers can readily grasp the component with a firm full-surfaced engagement, heat dissipating flanges are of such generous area and in such an advantageous location that they become especially good heat dissipators for all manner of use.

With these and other objects in view, the invention consists in the construction, arrangement and combination of the various parts of the device whereby the objects contemplated are attained, as hereinafter set forth, pointed out in the appended claims, and illustrated in the accompanying drawing.

Figure 1:
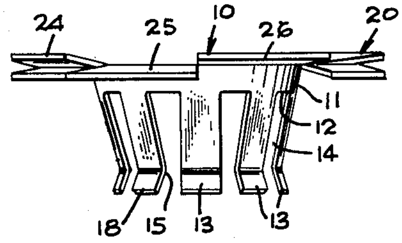
FIGURE 1 is a side elevational view of one of the coolers.
Figure 2:
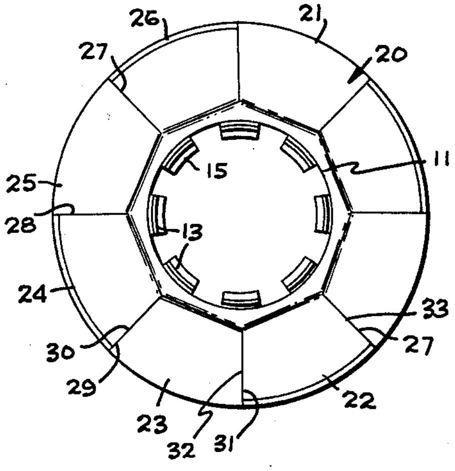
FIGURE 2 is a plan view of the cooler of FIGURE 1.
Figure 3:
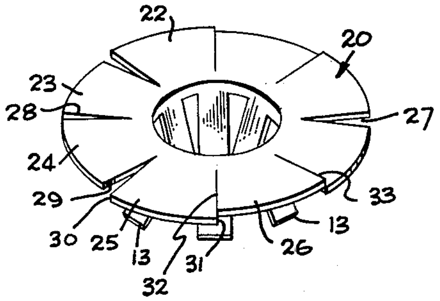
FIGURE 3 is a top perspective view of the cooler.

In an embodiment of the invention chosen expressly for the purpose of illustrating the principle, there is shown a transistor cooler comprising a body 10 which is annular to a substantial degree and in this embodiment circumferentially continuous. The body is formed of a single piece of relatively thin sheet metal. A particularly satisfactory metal is one known as Berylco 25 Strip, .015 inch thick. The material is such that it can be readily stamped, formed, and drawn when need be from a flat sheet to the form of the invention shown in the drawings.

The body has an axially extending annular rim 11 and from an edge 12 of the annular rim extend a plurality of circumferentially spaced resilient legs 13. Between the legs are spaces 14 which are frequently of lesser width than the width of the legs. The legs are spring elements and extend radially inwardly in an oblique direction. At the lower or free end of each leg is a radially inwardly extending configuration 15 which is somewhat flat in order to provide an ample area of contact at each point of engagement with the component such as a transistor 16 or 17. Adjacent the inwardly extending configuration is a radially outwardly extending tip 18 which slopes in an obliquely outward direction so as to permit the legs to slide easily over the transistor when the cooler is applied. phere.

On the opposite side of the body from the legs 13 is a somewhat composite flange indicated generally by the reference character 20. The flange, in the embodiment shown, has an outer circumference 21 more or less twice the diameter as the circumference of the annular rim 11. Although this dimension is not critical it should be appreciated that the large diameter of the flange is for the purpose of providing a relatively substantial metallic area for the dissipation of heat into the surrounding atmos- The flange is divided into a plurality of segments 22, 23, 24, 25, 26, etc. The segments are separated by slits 27 in such fashion, for example, that edges 28 and 29 are provided on the segment 24, edges 30 and 31 on the segment 23 and edges 32 and 33 on the segment 22.

Figure 4:
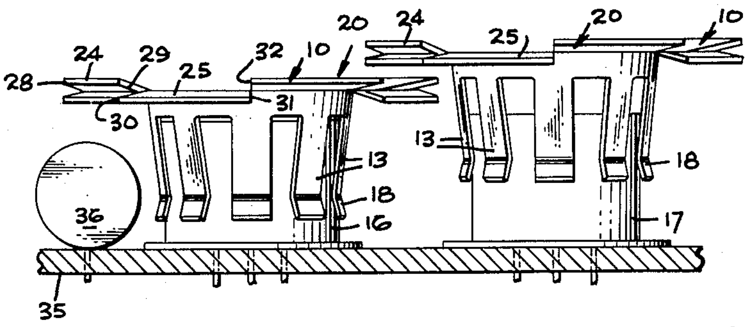
FIGURE 4 is an elevational view of a typical mounting arrangement showing multiple components crowded together in relatively close relationship and provided with coolers attached in a fashion permitting overlapping without interference.

In order to provide a staggered effect in the arrangement of the segments 22, 26, etc., alternate segments are bent upwardly and intermediate segments are bent downwardly as viewed in FIGURES 1 and 4. Under circumstances where the segment 24 is bent upwardly as shown and the segment 25 is bent downwardly, the edge 29 of the segment 24 will be separated appreciably from the edge 30 of the segment 25. Similarly, the opposite edge 31 of the segment 25 is separated by a considerable distance from the adjacent edge 32 of the segment 26. This general staggered relationship extends entirely around all of the segments of the flange. Although the segments are bent up and down bodily, it will be appreciated that a comparable effect can be secured by giving each of the segments a slight twist, the result of which nevertheless will inevitably separate adjacent edges and produce a varigated pattern effect wherein the edges provide numerous traps to divert the flow of air which may be induced around the flange and induce a degree of turbulence thereby to enhance contact of the air with the cooler as well as with the appropriate transistor.

Moreover, by reason of providing legs 13 as shown, relatively long as compared with the overall height of the transistor 16 or 17 as the case may be, the flange is located above the top of the transistor at a relatively appreciable height above a printed circuit board 35 upon which transistor such as the transistor 16 or 17 may be mounted. By way of example, still another component 36 is also mounted on the circuit board, relatively close to the transistor 16. Despite the closeness of the component to the transistor 16, the flange 20 of the cooler is at an elevation higher than the top of the component so that it overlies the component and permits the component to be mounted in snug relationship with respect to the transistor. Also because of the height of the cooler relatively and the overlying relationship of the flanges two transistors, like transistors 16 and 17 can be mounted relatively close together and the flanges permitted to overlap each other. The overlapping relationship instead of being detrimental is, in fact, advantageous because the staggered relationship of the many segments adds appreciably to the generating of a desirable degree of turbulence as air flows in, through, and around the coolers and the components.

Further still, by reason of the fact that the segments are of relatively thin sheet metal material, a great many coolers with many overlapping flange portions can be tolerated in a small area without the prospect of an accumulation of mass or volume which would otherwise tend to serve as a heat reservoir. Contrary to this undesired result, the many thin sections comprising the segments provide many active and efficient heat radiating surfaces which radiate heat away to a marked degree as well as serving as deflectors for dissipating heat by convection.

While the invention has herein been shown and described in what is conceived to be the most practical and preferred embodiment, it is recognized that departures may be made therefrom within the scope of the invention, which is not to be limited to the details disclosed herein but is to be accorded the full scope of the claims so as to embrace any and all equivalent devices.

Having described the invention, what is claimed as new in support of Letters Patent is:

1. In a cooler for a transistor a substantially annular body of sheet metal, an annular rim on one end of the body, said rim being of substantial breadth providing a collar extending in an axial direction, said collar having an inside surface facing generally in a radially inward direction, a plurality of circumferentially disposed resilient legs extending in a generally axial direction from one edge of said rim, the free end of each of said legs having a radially inwardly extending formed portion smaller in diameter than the circumference of the transistor adapted to engage the transistor, an inwardly facing and radially outwardly tilted tip spring biased inwardly and adapted to slide over the transistor when the cooler is applied thereto, said collar having the inside face thereof throughout the circumference spaced radially outwardly with respect to the location of said formed portions, a radially outwardly extending heat dissipating flange on the end of the body opposite said legs, said flange comprising a plurality of separate segments attached to said rim on the edge thereof opposite from the edge to which said legs are attached, each of said segments having a breadth in a radial direction less than the distance between inside edges of diametrically opposite segments, each of said segments being displaced in a generally axial direction with respect to the next adjacent segment to produce a staggered effect whereby to create a turbulence in convection currents flowing around the cooler.

2. In a cooler for a transistor a substantially annular body of sheet metal, an axially facing circumferentially continuous annular rim portion on one end of the body, said rim being of substantial breadth providing a collar extending in axial dirction, said collar having an inside surface facing in a general radially inward direction, a plurality of circumferentially spaced resilient legs extending in a generally axial direction from said annular rim, said legs being spaced from each other forming openings therebetween, said legs having the free end of each extending radially and resiliently inwardly and together forming an enclosure smaller than the exterior of a transistor whereby to engage the transistor, each said leg having an inwardly facing radially outwardly tilted tip adapted to slide over the transistor when the cooler is applied thereto, ends of said legs opposite the free ends being spaced a substantial distance outwardly relative to the location of said radially inwardly extending ends, a radially outwardly extending heat dissipating flange on a radially extending edge of said annular rim, said flange having an outside diameter substantially larger than the diameter of the annular rim, said flange having a plurality of separate segments, each of said segments having a breadth in a radial direction less than the distance between inside edges of diametrically opposite segments, each said segment being tilted in a generally axial direction with respect to the next adjacent segment a distance at the outer end thereof several times less than the breadth of the flange whereby to space adjacent edges from each other in a relationship adapted to create a turbulence in convection currents flowing around the cooler.

3. In a cooler for a transistor a substantially annular circumferentially continuous body comprising a single piece of sheet metal, an axially extending annular rim on one end of the body, said rim being of substantial breadth providing a collar extending in an axial direction, said collar having an inside surface facing in a general radially inward direction, a plurality of circumferentially spaced resilient legs extending in a generally axial direction from an axially extending edge of said rim, said legs having spaces therebetween of width less than the width of the legs, said legs being tilted resiliently inwardly toward the central axis of said body and together forming an enclosure smaller than the exterior of the transistor, the free end of each of said legs having a radially inwardly extending formed portion and a radially outwardly tilted tip adapted to slide over the transistor when the cooler is applied thereto, the inside surface of said collar being spaced radially outwardly relative to the location of the respective formed portions, a radially outwardly extending heat dissipating flange on a radially facing edge of said rim, said flange having an outside diameter substantially twice as large as the diameter of the annular rim, said flange having a plurality of radially extending slits extending through the outer circumference defining a plurality of separate segments, each of said segments having a breadth in a radial direction less than the distance between inside edges of diametrically opposite segments, each of said segments having opposite edges tilted in a generally axial direction with respect to the next adjacent edge whereby to space adjacent edges from each other in a relationship adapted to create a turbulence in convection generated by heat emitted from the transistor and the cooler, said legs being of comparable length and having said length at least as great as the breadth of said flange.

(References on following page)

References Cited by the Examiner

UNITED STATES PATENTS

| | | | |
|---|---|---|---|
| Re. 25,184 | 6/62 | McAdam | 317—234 |
| 1,521,880 | 1/25 | Guarino | 165—182 X |
| 2,402,262 | 6/46 | Sewell | 165—182 |
| 2,656,808 | 10/53 | Plumeri et al. | 165—181 X |
| 2,737,370 | 3/56 | Frisch et al. | 165—180 X |
| 2,862,991 | 12/58 | Reardon | 165—185 X |
| 2,917,286 | 12/59 | Deakin | 165—80 |
| 2,964,688 | 12/60 | McAdam | 317—234 |
| 2,965,555 | 12/60 | Hall | 165—181 X |
| 3,023,264 | 2/62 | Allison | 165—180 X |
| 3,033,537 | 5/62 | Brown | 165—47 X |
| 3,035,419 | 5/62 | Wigert | 174—15 X |
| 3,057,950 | 10/62 | Allison | 165—185 X |

FOREIGN PATENTS

| | | |
|---|---|---|
| 331,392 | 7/30 | Great Britain. |
| 579,610 | 8/46 | Great Britain. |

CHARLES SUKALO, *Primary Examiner.*

HERBERT L. MARTIN, *Examiner.*